(12) United States Patent
Dempsey

(10) Patent No.: US 9,407,278 B1
(45) Date of Patent: Aug. 2, 2016

(54) DIGITAL TO ANALOG CONVERTER

(71) Applicant: ANALOG DEVICES GLOBAL, Hamilton (BM)

(72) Inventor: Dennis A. Dempsey, Newport (IE)

(73) Assignee: ANALOG DEVICES GLOBAL, Hamilton (BM)

(*) Notice: Subject to any disclaimer, the term of this patent is extended or adjusted under 35 U.S.C. 154(b) by 0 days.

(21) Appl. No.: 14/789,705

(22) Filed: Jul. 1, 2015

(51) Int. Cl.
H03M 1/66 (2006.01)
H03M 1/06 (2006.01)
H03M 1/00 (2006.01)
H03M 1/68 (2006.01)
H03M 1/80 (2006.01)

(52) U.S. Cl.
CPC ............ *H03M 1/0604* (2013.01); *H03M 1/002* (2013.01); *H03M 1/66* (2013.01); *H03M 1/68* (2013.01); *H03M 1/808* (2013.01)

(58) Field of Classification Search
CPC ..... H03M 1/0604; H03M 1/68; H03M 1/002; H03M 1/808; H03M 1/66
USPC ......................................................... 341/144
See application file for complete search history.

(56) References Cited

U.S. PATENT DOCUMENTS

| 5,396,245 | A | | 3/1995 | Rempfer | |
| 5,554,986 | A | * | 9/1996 | Neidorff | H03M 1/682 341/145 |
| 5,859,606 | A | | 1/1999 | Schrader et al. | |
| 5,969,657 | A | | 10/1999 | Dempsey et al. | |
| 6,154,162 | A | * | 11/2000 | Watson | H03M 1/0673 341/144 |
| 6,448,917 | B1 | | 9/2002 | Leung et al. | |
| 7,283,082 | B1 | * | 10/2007 | Kuyel | H03M 1/682 341/145 |
| 9,124,296 | B2 | * | 9/2015 | Dempsey | H03M 1/66 |

* cited by examiner

*Primary Examiner* — Brian Young
(74) *Attorney, Agent, or Firm* — Patent Capital Group

(57) ABSTRACT

In an example, there is disclosed a digital to analog converter (DAC) architecture that in a first aspect provides first and second parallel paths through the DAC so as to allow a separation of a coarse and fine aspect of the DAC transfer function is described. In another aspect a DAC architecture is provided that comprises at an output of the DAC an interpolator arranged to extend the resolution of the overall DAC architecture by interpolating within the voltage range of the DAC stages that precede the interpolator. Such an interpolator can be used with both an amplifier and/or comparator to provide one or more of a buffering of the output and/or a comparison of the DAC output with signals from other circuit elements. Features of the first and second aspects may be used independently of one another.

28 Claims, 9 Drawing Sheets

DIGITAL TO ANALOG CONVERTER

FIELD

The present teaching relates to a digital to analog Converter, DAC, and particularly to a DAC architecture that in a first aspect provides first and second parallel paths through the DAC so as to allow a separation of a coarse and fine aspect of the DAC transfer function. In another aspect a DAC architecture is provided that comprises at an output of the DAC an interpolator arranged to extend the resolution of the overall DAC architecture by interpolating within the voltage range of the DAC stages that precede the interpolator. Such an interpolator can be used with both an amplifier and/or comparator to provide one or more of a buffering of the output and/or a comparison of the DAC output with signals from other circuit elements. Features of the first and second aspects may be used independently of one another.

BACKGROUND

Real-world analog signals such as temperature, pressure, sound, or images are routinely converted to a digital representation that can be easily processed in modern digital systems. In many systems, this digital information is converted back to an analog form to perform some real-world function. The circuits that perform this step are digital-to-analog converters (DACs), and their outputs are used to drive a variety of devices. Loudspeakers, video displays, motors, mechanical servos, radio frequency (RF) transmitters, and temperature controls are just a few diverse examples. DACs are often incorporated into digital systems in which real-world signals are digitized by analog-to-digital converters (ADCs), processed, and then converted back to analog form by DACs.

A DAC produces a quantized or discrete step analog output in response to a binary digital input code and the analog output is commonly a voltage or a current. To generate the output, a reference quantity, or level, (usually the aforementioned voltage or current) is divided into binary and/or linear fractions. Then the digital input drives switches that combine an appropriate number of these fractions to produce the output. The number and size of the fractions reflect the number of possible digital input codes, which is a function of converter resolution or the number of bits (n) in the input code. For n bits, there are $2^n$ possible codes. The analog output of the DAC output is the digital fraction represented as the ratio of the digital input code divided by $2^n$ (or $2^n-1$ depending on the specific definition used) times the analog reference value.

SUMMARY

These and other problems are addressed by a Digital to Analog Converter, DAC, architecture provided in accordance with the present teaching. In accordance with the present teaching, the DAC architecture comprises multiple stages where each stage is configured to convert a specific group of bits of a N-bit digital word. In one aspect a first stage will convert a group of higher order bits of the N-bit digital word whereas a second stage will convert remaining lower order bits. In accordance with the present teaching the first and second stages may be provided as parallel paths between an input node of the DAC and an output node of the DAC. In effect this provides a dual output DAC.

In another aspect of the present teaching a DAC architecture comprising an amplifier coupled to an output of a multi-stage DAC and configured to provide an additional DAC stage to the multi-stage DAC is provided. The amplifier may be configured as a comparator wherein one input to the amplifier is provided from the multi-stage DAC and this is compared with a second input to the amplifier to provide a quantized output.

Within this context the term amplifier as used in the context of the present teaching could be an operational amplifier—opamp—or could be provided by one or more components of an operational amplifier. In this way it will be appreciated that the amplifier of the present teaching should not be construed as being limited to an operational amplifier implementation as other amplifier circuitry such as transconductance elements could also be used. The signal output from an amplifier per the present teaching may or may not be of the same form as the signal input to the amplifier, such as for example including voltage to current translations or the other way around.

These and other features will be better understood with reference to the following exemplary arrangements which are provided to assist in an understanding of the present teaching but in no way to limit the scope to that specifically described.

DETAILED DESCRIPTION OF THE DRAWINGS

Figure 1:
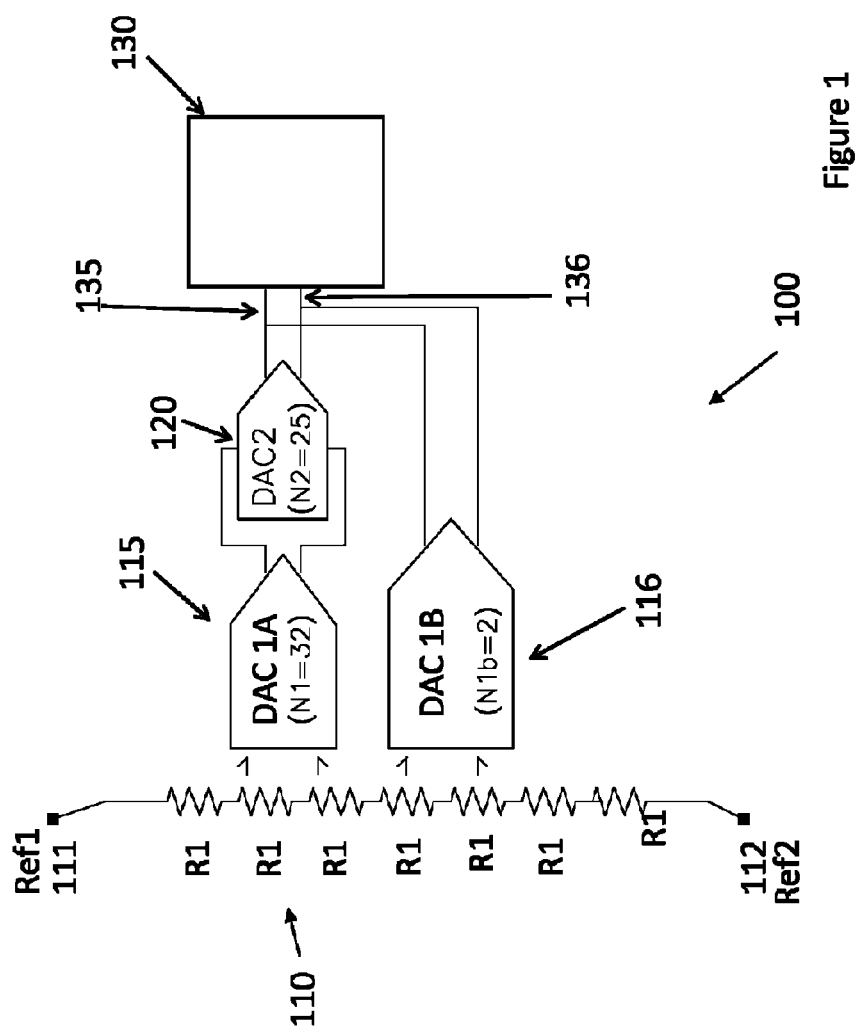
FIG. 1 is a block schematic of a DAC architecture in accordance with the present teaching.

The present teaching will now be described with reference to exemplary arrangements implemented in the form of a multi-string digital to analog converter, DAC.

DACs are well known in the art and examples of such DACs are described in co-assigned U.S. Ser. No. 13/841,516 the content of which is incorporated herein by way of reference. Such DACs generally provide a single output dependent on the input code provided to the DAC. Other configurations use a shared first part of the signal chain but provide a diverging or forked output whereby first and second output channels are provided.

Digital to analog converters are used to convert an input digital signal to corresponding analog output. Conventional DACs are implemented using binary transitions but in accordance with the present teaching, there is no limiting requirement for such binary transitions, although the circuits will be described in that context. Therefore where the present disclosure refers to MSB and LSB transitions, which are typically interpreted in the context of a binary state change reflecting specifics of a digital input code, within the context of the present teaching these should be interpreted more generally as state changes which do not necessarily represent a binary transition.

It will be appreciated that a multi-string DAC may also be considered a multi-stage DAC where each stage comprises a string of impedance elements. In such a multi-string converter, a first stage uses a first string for converting a group of higher order bits of an N-bit digital word and a second stage using a second string to decode the remaining, lower order bits. Within the context of the following, which is provided to assist the person of skill in an understanding of features and benefits of an arrangement in accordance with the present teaching, each of the strings will be described with reference to an exemplary implementation using resistors. It will be appreciated that resistors are an example of the type of impedance element that may be used and it is not intended to limit the present teaching to an implementation where resistors are used exclusively as impedance elements. In this regard it will be appreciated that resistors may be a preferred type of impedance element, particularly in scenarios where the voltage across the string is high—such as the string that is coupled to the reference terminals of the converter. In other strings where the voltage is relatively small, other elements such as MOS devices may also be used. The present teaching should therefore not be construed as being limited to a multi-resistor string DAC.

The reference terminals are typically coupled to the first string and the following example illustrates a specific example of a voltage source. As will be appreciated by those skilled in the art the term voltage source is intended to define and include an active voltage supply, a voltage buffer or a current source which is coupled to other circuit elements and configured to provide a target voltage. It will be appreciated that a series resistance can be used between a reference terminal and a voltage or current source and such modifications or configurations will be appreciated by those of ordinary skill in the art. Within this general definition it will be appreciated that the present teaching should not be limited to any one specific configuration and hence the use of the term reference terminal.

FIG. 1 shows an example, in block schematic form, of a multi-string digital to analog converter, DAC, 100 provided in accordance with the present teaching. The DAC comprises a first DAC string 110 with a plurality of impedance elements, R1. The first string 110 is coupled to reference terminals or nodes, in this specific example reference terminals provided by a voltage source at first 111 and second 112 reference nodes and labelled Ref1 and Ref2 respectively. The first string 110 provides elements of a first stage of the DAC 100.

In the schematic of FIG. 1, the reference nodes are illustrated as being simply a first and second reference. It will be appreciated that these could be provided in the form of positive and negative voltage reference nodes or indeed different potentials could be provided as required. It will be understood that reference nodes could be driven by voltage sources/buffers/followers or coupled to passive or active networks and that these could be implemented as a sub-part of a high-level circuit and the present teaching is not intended to be limited to any one specific implementation.

In a conventional DAC arrangement the first string would be coupled to a single second stage and where there is a need for the DAC to provide N state changes a large proportion of those state changes, N1, is provided by a switching of a voltage produced across at least one of the impedance elements in the first string 110 across a set of impedance elements provided in a second string. A second number of states N2 would be provided by a switching of elements in the second stage and so on. Each of these stages would be provided in series.

In contrast, the present teaching provides two parallel paths from the first string 110, each of the first and second parallel paths differing in their respective resolution. A first path is provided by coupling a first set of impedance elements provided by a DAC1A stage, 115, to the first string 110 and a second path is provided by coupling a second set of impedance elements provided by a DAC1B stage, 116, to the first string 110. The path through each of these DAC1A and DAC1B stages from the first string can be switched independently of the path through the other of the DAC1B and DAC1A stage. Each of the DAC1A and DAC1B stages can be considered an intra-string multiplexer whose switching in combination with the impedance elements defined in the first string 110 is used to provide a defined number of states. The DAC1A and DAC1B each define a primary stage in each of a first DAC path and a second DAC path, the first and second DAC paths being arranged so as to be coupled to the same first string 110 and also to a common node, which will be described below as a gain block 130.

The circuit is configured such that operably a switching of the plurality of impedance elements across the primary stage in the first DAC path provides a first plurality of N1 state changes and a switching of the plurality of impedance elements across the primary stage in the second DAC path provides a second plurality of N1b state changes, the second plurality N1b being less than the first plurality N1. Each of the first DAC path and the second DAC path are coupled to a common output 130 of the DAC circuit 100.

As detailed above, the DAC1A stage typically has a greater resolution than that provided by the DAC1B stage. In the example of FIG. 1, exemplary numbers are that DAC1A has 32 impedance elements (N1=32), whereas DAC1B has 2 impedance elements (N1b=2). In this way use of the first path through the DAC1A stage will provide a coarse transfer function and use of the second path through the DAC1B stage will provide a finer transfer function.

As explained above, it will be appreciated that each of the DAC1A and DAC1B stages provide a multiplexing function which is used in combination with the impedance elements of the first string 110 such that code changes are effected by a combination of one or both of the DAC1A and DAC1B being switched relative to individual impedance elements of the first string 110. Each of the plurality of impedance elements within DAC1A and DAC1B are configured as an impedance network that has its own network impedance. It will be appreciated that the specifics of the impedance elements may include resistor string architectures or other type of DAC impedance architectures as will be appreciated by those of skill in the art.

The DAC1A stage can, in a fashion that will be appreciated by those of ordinary skill in the art, be coupled to successive DAC stages in a serial fashion. Each of these successive DAC stages will typically provide a finer tuning of the transfer function. In the example of FIG. 1, DAC1A is coupled to a DAC stage, DAC2, 120, which is provided with a set of 25 impedance elements (N2=25). It will be appreciated however that the number of impedance elements provided in each of the DAC stages is related to the number of bit resolution required by the architecture as a whole. In this way each of the plurality of DAC stages is configured to provide a number of state changes. In certain configurations, such as those shown in the FIG. 1 and the 12 bit example in FIG. 2, at least one of the successive stages of the plurality of DAC stages have a higher resolution than a preceding stage.

In contrast, the DAC1B stage will typically bypass successive sets of impedance elements as the resolution provided by the DAC1B stage is intended to be a fine level resolution. The outputs of the DAC1B stage are levels which are provided by a combination of loading on DAC1B of the DAC2 circuitry and the switching of this loading to achieve a desired LSB loading effect. In this way the overall output of the DAC can be provided by a loading on the primary stage 110 as effected by the first parallel path—DAC1A, DAC 2—during a switching of the second DAC path as provided by DAC1B. Each of the two paths can be considered as providing a complimentary role to the other in facilitating individual codes as required by the DAC architecture.

The path from the DAC1B output will typically be coupled to a path originating from the DAC1A output at a location that is downstream of all sets of impedance strings. By linking the two paths at an output block 130, the overall DAC architecture is one providing a multi-stage multi-string DAC providing a first 135 output and a second 136 output which are then coupled to the output block 130 of the DAC architecture. In this way each of the first DAC path and the second DAC path are coupled to a common output block of the DAC circuit.

The output block provides a gain block. The gain block takes first 135 and second 136 analog voltage inputs. The difference in these two inputs is then gained and provided as an output of the DAC architecture. This output can be a single ended output per the illustrated example or could be a differential output. This gain block can be configured as a comparator and when so configured, this output is provided in a quantized digital form. The gain block can also be configured as an amplifier and when so configured, the output is provided as an analog output whose value is dependent on the first and second inputs—as will be appreciated by those of ordinary skill in the art. The gain block where provided in either of an amplifier or comparator configuration may also include an interpolator function which will facilitate a provision of additional sets of programmable configurations which can be usefully employed in providing the DAC transfer function. In effect, this interpolator provides an additional DAC stage to each of the first DAC path and the second DAC path. As shown in the schematic representation of FIG. 1, the gain block can be coupled to first and second outputs from each of the first DAC path and the second DAC path. In other configurations the gain block 130 may be coupled to only one output from either of the first DAC path and the second DAC path.

Figure 2:
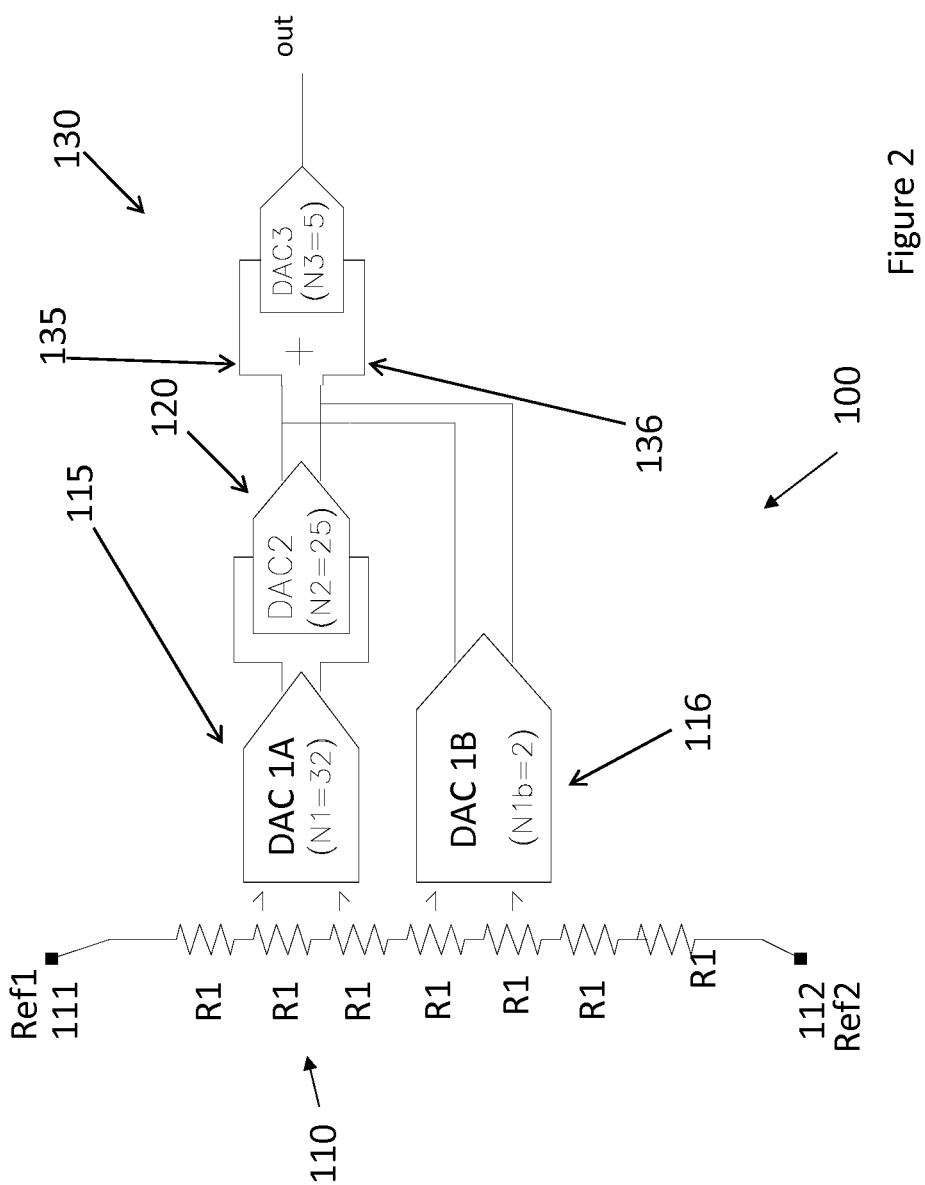
FIG. 2 shows a modification of the circuit of FIG. 1 to include an interpolation DAC stage.

FIG. 2 shows an example of the type of output block that can be coupled to the first 135 and second 136 outputs of the DAC of FIG. 1. In this arrangement of the gain block, specifics of an interpolator block is detailed When providing an interpolation function, it will be appreciated that a DAC function is also provided and the interpolator block provides in this example a sequential stage of the DAC architecture to the DAC stages in each of the first DAC path and the second DAC path. Each of the first and second outputs from the first DAC path and second DAC path respectively, are selectively coupled to this DAC stage, which provides a further component of the overall DAC transfer function. It will be appreciated that this schematic illustrates one example of how interpolation can be provided within the context of the present teaching but other interpolation circuitry and configurations could equally be employed using known architectures as will be appreciated by those of skill in the art. It will be appreciated that the interpolation can be provided by a common element such as the identified DAC3 or could be provided by additional or alternative interpolation elements configured to provide N4 states as will be described below.

In this configuration of FIG. 2, which provides a 12 bit DAC architecture, the number of states provided by each stage reduces with successive stages from 32 to 25 to 5. In another configuration, for example one that could be used in a 10 bit DAC architecture the number of states could be 8 in a first stage, 25 in a second stage and 5 in a third stage. In another configuration that could be usefully employed in an approximately 7 bit resolution DAC, the number of states provided by each stage could be 5 in a first stage, 5 in a second stage and 5 in a third stage. Therefore, while higher resolution DAC architectures will typically provide successive stages having lower resolution the present teaching envisages and provides architectures which are not so defined. It will be appreciated therefore that by suitably configuring the number of resistors that are switchable in any one configuration, that a common core can be used to providing varying bit architectures. As the number of impedance elements that are required in configurations per the present teaching are reduced relative to known DAC architectures it will be appreciated that redundancy can be usefully employed to assist design configuration and/or optimization as required.

It will be seen that there are separate output multiplexers for each of DAC2 and DAC1B in the illustrated separate paths shown in FIG. 2. DAC2 has a differential output which provides a target range for interpolation by the DAC3 interpolation stage. DAC1B provides an output to DAC3 also but this output is not interpolated but instead buffered and can be considered equivalent to the value of the interpolator functionality provided by DAC3 at one of full-scale or zero-scale. Two outputs are described in the block diagram of FIG. 2 as it is advantageous to use a selected one of the interpolator inputs to minimize transient glitching switching between DAC2 and DAC1B operation for neighbouring DAC codes.

In such a configuration it will be appreciated that a switching of the DAC1B stage can be used to generate $N1*2$ states as made up from $(N1-1)*2+1$ high impedance change+1 full scale state change. It will be appreciated that the $(N1-1)*2$ is derived from the fact that there are two LSB configurations provided at the nodes between the N resistors i.e. N−1 nodes, giving $(N-1)*2$ LSBs. Each of the two end terminals for zero-scale and full-scale only provide one LSB, which is a static LSB value, with the result that the states DAC1B provides in total$=(N1-1)*2+2=N1*2$.

The interpolation function in combination with DAC2 can provide $N2*N3+1$ states—it will be appreciated that this additional state is derived from the fact that there is an extra state provided at the end of the string of $N2*N3$ elements, analogous to the fact that a series of N resistors has N+1 nodes. It will be appreciated that $(N2*N3+1)$ resolution is achieved for each impedance element in the first string and thus the overall number of states provided by combination of first string, DAC2 and the interpolation is $N1*(N2*N3+1)$.

The DAC3 interpolation can also be used to provide an additional number of states by interpolating within the intrastring multiplexer provided by DAC1A to provide N4 states. If this optional interpolation operation is provided then the number of states that may be provided is equivalent to $N4*LSB$. The inclusion of such an optional arrangement provides a four stage mode DAC architecture and can be usefully employed in configurations where the number of states N4 required is greater than or equal to 0. If N4 is equal to zero the usefulness of this optional interpolation is negated.

In this way, the person of skill will understand that the overall number of states, Nstates, that can be provided by this DAC architecture is $N1*(N2*N3+3)+2*N1*N4$. This total number of codes can also be expressed as $N1*(N2*N3+1)+2*N1*(N4+1)$ where the first group of terms represents the number of states provided by interpolation across impedances in the second string and the second group of terms represents the number of states achieved within the intra-string MPX voltage range (the last N4 term) and on the DAC1 side (the last+1 term) of the intra-string MPX.

It will be understood that N1 and N2 are greater than zero and typically much greater than 1. The number of states N3 is that number that is provided by the interpolation element DAC3, including that number of states that can be provided when the DAC3 is operated at zero and full-scale when used with DAC1 and DAC2. It will be appreciated that the number of states that are actually desired from N3 will determine its mode of operation. For example, if N3=2, then the gain block 130 is effectively operating as a multiplexer operating from zero to full-scale only. For interpolation modes, N3>2 and to provided moderate to high resolution it is desirable that N3>>2. In this way it will be appreciated that the specifics of N3 are optimized within a practical upper range as set by precision and design requirements of this interpolation sub-block.

As discussed above an architecture per the present teaching may be configured to provide a further number, N4, of states which may be effected by interpolating within the intrastring network of DAC1A. Where employed this advantageously will use the same interpolator block DAC3 so as to minimise additional circuitry. For the ease of explanation a single DAC3 element is illustrated in the figures but it will be appreciated that where that element DAC3 is providing N3 or N4 states that it can be provided by the same or different interpolating DAC. In this way the schematic should not be construed as limiting the circuitry to a single DAC3 element that provides dual functionality in provision of N3 and N4 states.

Where N4 is equal to zero there is no interpolation within the intra-string network of DAC1A. Where the number of states N4 is greater than zero, these N4 states are provided by interpolating within the intrastring multiplexer DAC1A voltage range. Such interpolation can be considered as derived from two different possible configurations.

In a first configuration N3>1, the DAC 3 element provides interpolation within the voltage range defined by the DAC1A-DAC2 path.

Such an arrangement can be used with N4=0 in which case there is no interpolation within the intrastring network of DAC1A. Where N4>0, interpolation is provided within the intrastring network. In a second configuration where N3=1 and N4>0, the output gain block 130 functions as a non-interpolating buffer and interpolation is provided within the intrastring network of DAC1A. This could be provided by the DAC3 element interpolating within the intrastring network voltage range or could be provided by a separate interpolating element configured to provide the desired number of N4 states.

Where provided, the N4 interpolation can typically be used to achieve 2*N1*N4 states, using the same, consistent level of interpolation vs the selected node(s) in the DAC string 110 for both above and below each R1 node transition and such an arrangement is preferred as it results in lower circuit complexity. However it will be understood that it is possible to vary N4 above vs. below the R1 node transition and along the DAC string 110 and unless otherwise stated it is not intended to limit to any one specific implementation.

Similarly, N3 is typically consistent and the same for each, matched unit impedance in string DAC2. However, it is appreciated than DAC2 string is not required to be exactly matched unit resistors, e.g. they could be positive integer multiples, and the interpolation is not required to be consistent vs DAC2 impedance elements although this is a preferred arrangement.

Irrespective of implementation, where these interpolation modes are desired, the impedance of the DAC1A network can be designed such that:

$$R on(DAC1A\ network) = (N4+1)*R1,$$

Where R1 is the impedance of the individual impedance elements R1 identified in the first string 110. Where DAC1A network interpolation is not desired, as provided when N4=0 this relationship reduces to:

$$R on(DAC1A\ network) = R1$$

The number of codes provided by intra-string interpolation=$2*N4*(N1-2)+2*N1=2*N4*N1$ It can be useful to select N4 to complement the choice of N3 such that the DAC3 functionality can be re-used without additional requirements with N4 (max)=N3−1 and N4 preferably selected to be a factor of (N3−1).

The power consumption of the overall architecture is determined from the relationship:

$$Iref = Vref/(N1*R1)$$

$$Power = Vref^2/(N1*R1)$$

Where Vref is the voltage between the two Ref terminals Ref1 and Ref2 and Iref is the current flowing through the resistor string 110. The Vref, first stage resolution N1, R1 unit resistor value and power consumption choices are all inter-related design variables that can be optimised or selected based on criteria as will be appreciated by those of skill in the art. For example, electing a maximizing of the value of Vref is good for signal to noise ratio but is limited by supply range and practical availability considerations. The N1 resolution choice is dictated by architecture optimization and as a result the value of R1 is generally most flexible as it has lower constraints than Vref and N1 and thus usually the easiest and most flexible variable to optimize. While it will be appreciated that size and layout configurations may affect this selection of R1, generally the degree of design flexibility diminishes from R1 to Vref to N1 to Iref. For ultra-low power applications, where power consumption is a key target, a maximization of N1*R1 resistance is desirable and the power consumption limit will be dictated by leakage limitations over the operating conditions. Returning to schematic of FIG. 1, it will be appreciated that the output block 130 provides a gain block that can be usefully configured to provide one or both of interpolation and comparator functionality. In such an arrangement it will be appreciated that while this may be advantageously employed with a DAC incorporating parallel paths from the first stage to the output block per the arrangement of FIG. 1, that this output gain block can also be usefully employed with different multi-stage DAC configurations.

Figure 3:
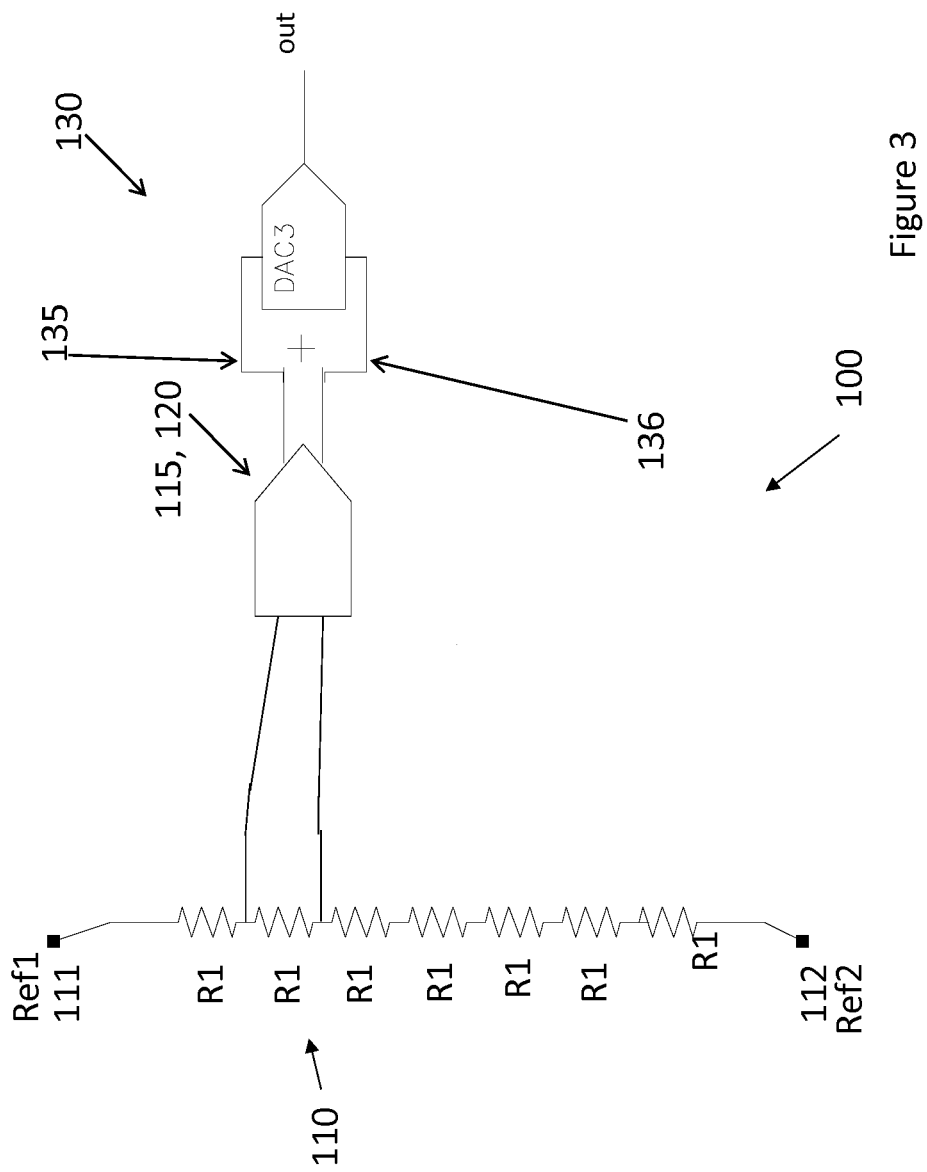
FIG. 3 shows a mode of operating a circuit per the teaching of FIG. 2 to provide a first set of states.
Figure 4:
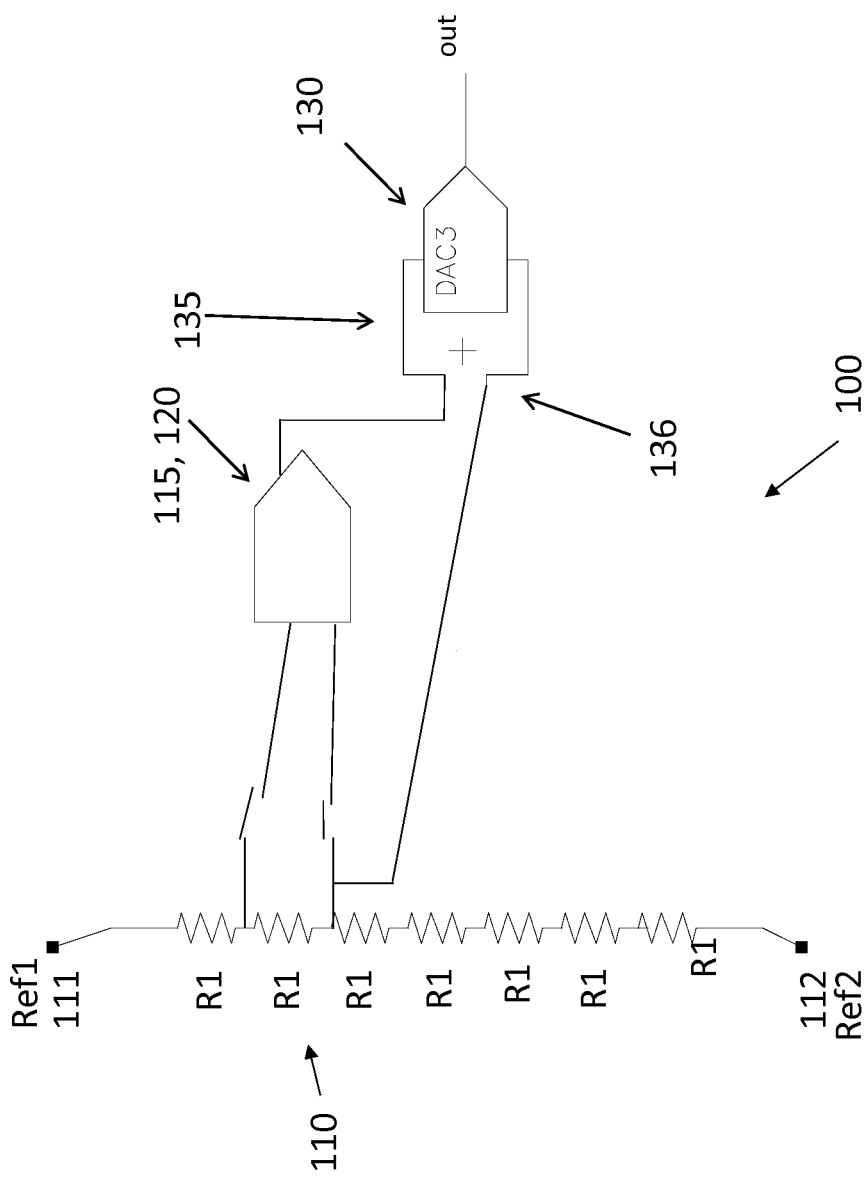
FIG. 4 shows an optional mode of operating a circuit per the teaching of FIG. 2 which can be usefully employed to provide more than 1 LSB transition across the multiplexer arrangement of DAC 1A.
Figure 5:
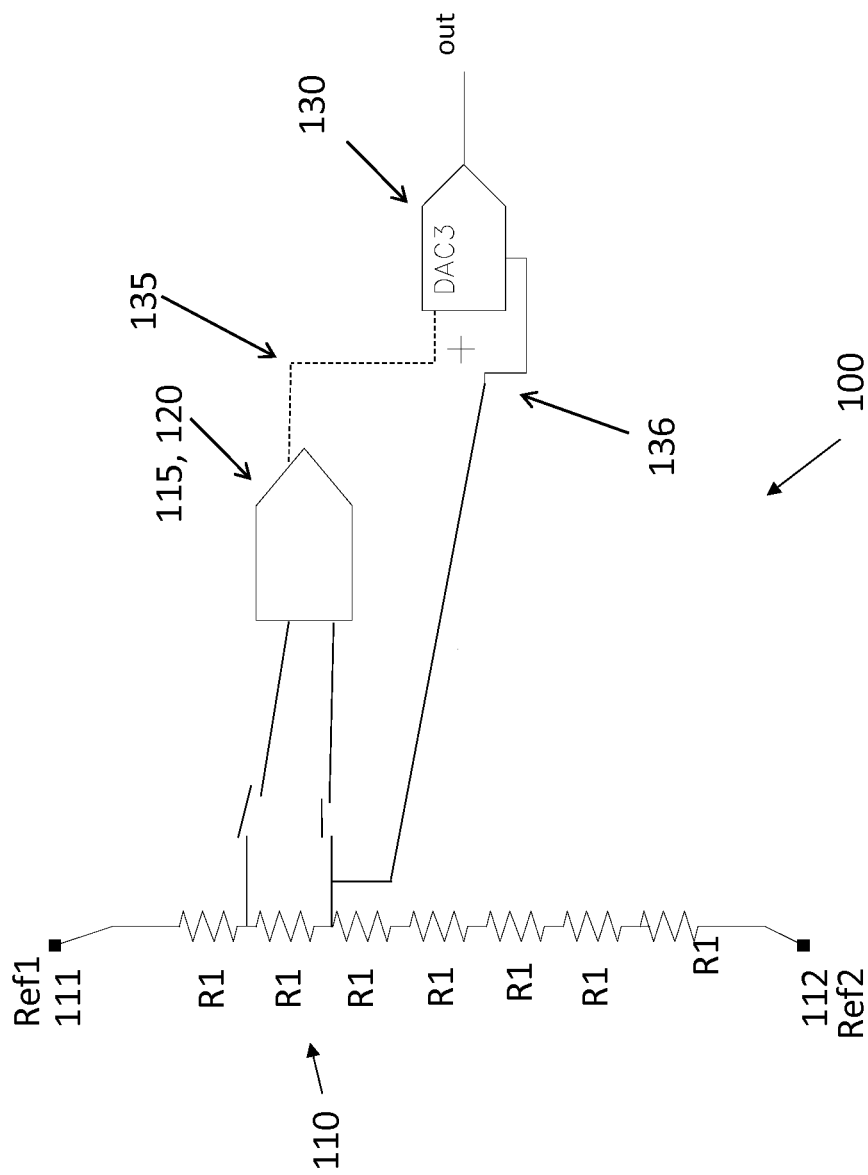
FIG. 5 shows a mode of operating a circuit per the teaching of FIG. 2 to provide a second set of states.

FIGS. 3, 4 and 5 show in schematic form how an architecture such as that shown in FIG. 2 can be arranged to provide one of four modes of operation. In a first configuration as shown in FIG. 3, the internal DAC, DAC3 interpolates across selected impedance elements within the DAC2 block providing a number of transitions determined from N3*LSBs for each DAC2 impedance element.

In the arrangement of FIG. 4, which is an optional interpolation operation, DAC3 is used to interpolate within the voltage range of the intra-string multiplexer provided by DAC1A and corresponds with the scenario outlined above with N4 being greater than zero. The number of LSBs that may be provided by interpolation within this intrastring network is defined by the value of N4. In this schematic the node 135 is driven by the multiplexer of DAC1A via DAC2. While shown as being coupled to a lower input line to the multiplexer it will be appreciated that this could be coupled to an upper input line.

In the arrangement of FIG. 5, there is no interpolation provided by DAC3 and such a configuration is provided with DAC3 at full scale or zeroscale. The DAC1A node is pulled up by a combination of DAC2 and the on-resistance of the multiplexer network provided by the DAC1A. Again in a similar fashion to FIG. 4 where the coupling was to a lower line, if DAC 3 is coupled to the other input node, then the DAC1A node is pulled down. It will be appreciated that the configuration schematics of FIGS. 4 and 5 are superficially similar in layout. A significant difference in operation is that in FIG. 5, the interpolator DAC3 is configured to operate at full scale or zero scale at the transition codes. In these scenarios, the node 135 may still be coupled to DAC3—as shown in dashed outline—to ensure that DAC3 maintains its DC steady state operation and minimizes transition glitching and other performance characteristics but it does not function to define the output voltage in response to changing input codes.

Figure 6:
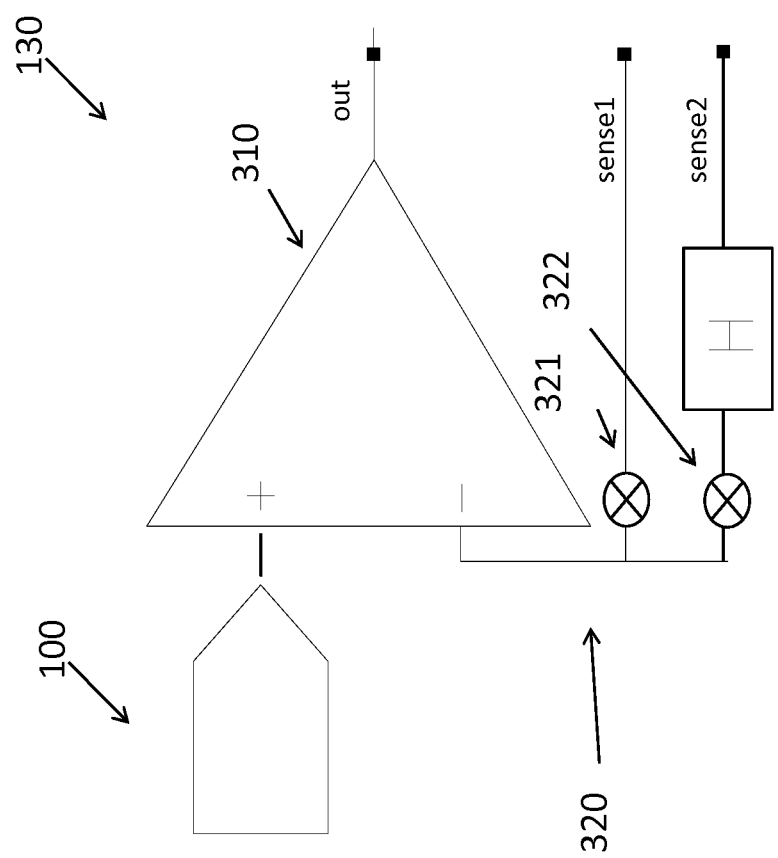
FIG. 6 shows an example of a comparator provided at the output of a DAC in accordance with the present teaching.

FIG. 6 shows an example of an output stage 130 that incorporates a gain block such as that described with reference to FIGS. 1 and 2 and that is configured to provide a comparative function. A DAC block 300 provides an input to this gain block 130. It will be appreciated that this DAC block 130 is intended to reflect that any multi-stage DAC arrangement can be usefully employed to provide an input to the output stage 130.

In this schematic, the gain block comprises an amplifier 310 and the DAC input is provided at a first input to the amplifier 310. A second input of the amplifier is coupled to a sense network 320. In this configuration, first 321 and second 322 sense inputs can be individually or collectively switched into the sense network so as to provide reconfigurable multiple channels. By allowing a reconfiguration of the sense network it will be further appreciated that the amplifier output is also reconfigurable. In the example of FIG. 6 one of the sense inputs incorporates a gain factor element "H" which as will be appreciated by those of ordinary skill is a conventional notation used to represent the feedback factor, as commonly used in control theory.

It will be appreciated that this schematic provides an exemplary implementation providing a single ended example but it could equally be implemented in a differential mode. It will be understood that modifications to that shown could include multiple high and/or low impedance paths. It is further possible to provide a DAC capability within one or more of the sense paths 321, 322.

Figure 7:
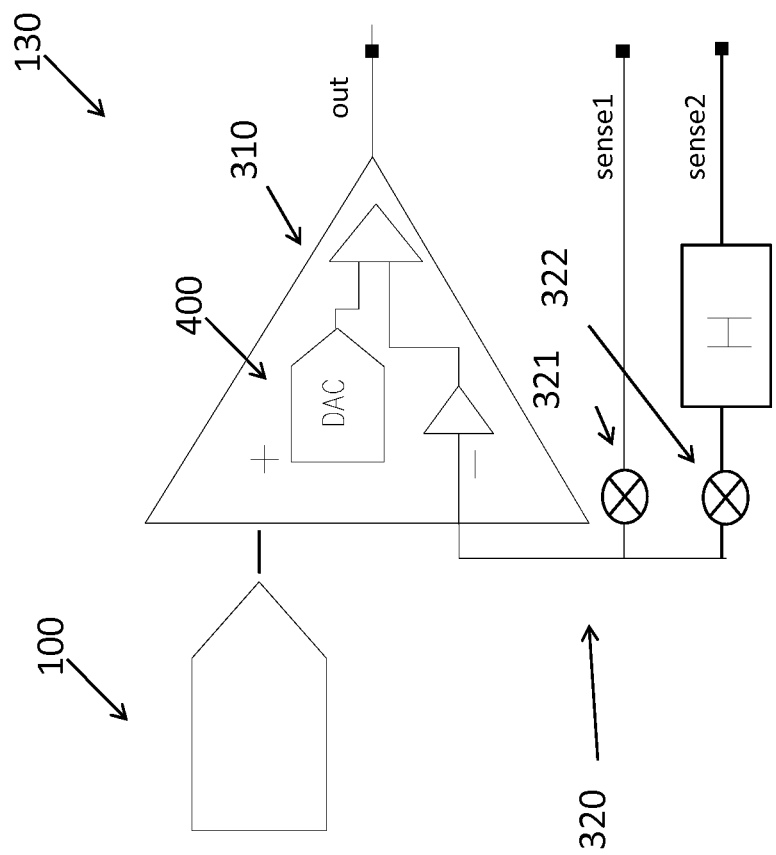
FIG. 7 shows a modification to the circuit of FIG. 6.
Figure 8:
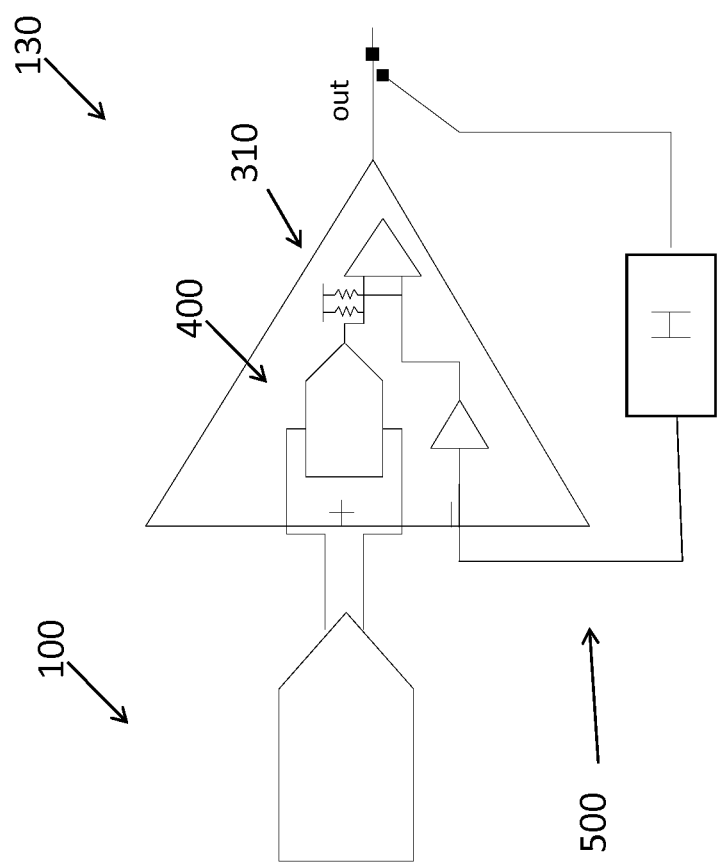
FIG. 8 shows another modification to the circuit of FIG. 6.

FIG. 7 shows another configuration that incorporates a DAC functionality within the amplifier. In this configuration one or both of the sense paths could be omitted or activated. The sense path provides a first input to the amplifier and the DAC 100 provides a second input which is then coupled to an internal DAC 400 provided within the amplifier. This internal DAC 400 provides an additional DAC stage to the DAC 100 and the output of the amplifier is a combination of the operation of the DAC elements with an input from the sense network. It will be appreciated that the arrangement of FIG. 7, and similarly FIG. 6, can be used with inputs other than the sense network illustrated. For example as shown in FIG. 8, a simple feedback loop 500 can be provided between the output of the amplifier 310 and the second input to provide a comparative function. In this example, the first input is coupled to a dual input from the DAC circuitry 100, as was previously referenced as being possible. The output gain configuration can be varied—for example a feedback capacitor can be incorporated into the feedback loop to compensate for RC delay in the feedback loop—as will be appreciated by those of ordinary skill in the art.

Figure 9:
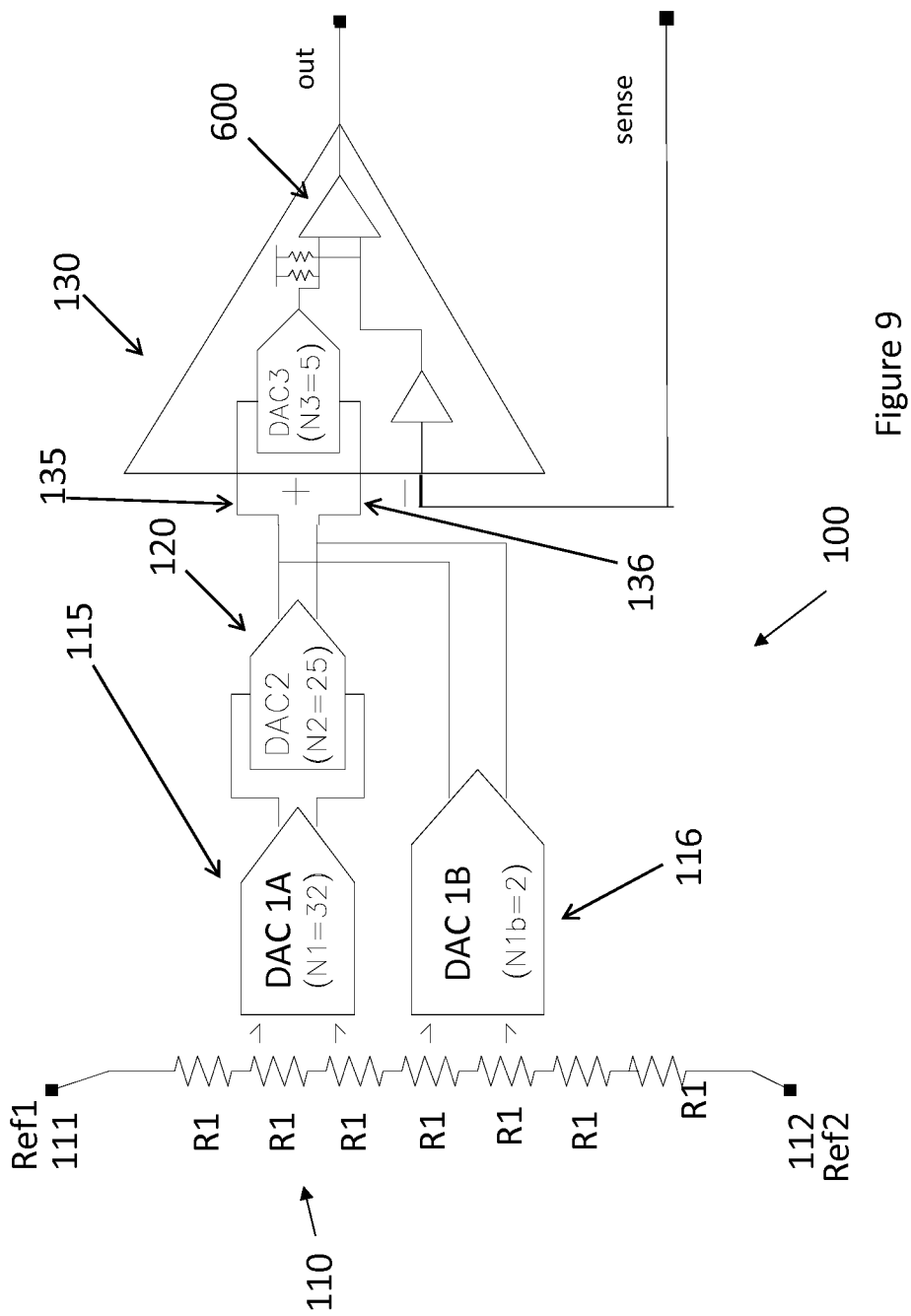
FIG. 9 shows a DAC architecture incorporating first and second parallel DAC paths coupled to a buffered interpolator in accordance with the present teaching.

FIG. 9 is a schematic representation showing an exemplary combination of multiple individual components that have been previously described with reference to FIGS. 1 to 8. A circuit per the teaching of FIG. 9 provides a buffered DAC that can be operated in one of two modes. In a first mode a DAC path through DAC1A, DAC2 and the gain block 130 provides a coarse DAC using an internal amplifier-interpolation. In a second mode a path through DAC1B to the in-amplifier interpolator provides a fine resolution DAC. As was described with reference to FIGS. 3 to 6, in a third mode the gain block is operating at full scale or zero scale and there is no interpolation within the voltage range defined by the DAC1A-DAC2 circuitry. Within the architecture shown in the gain block of FIG. 9, it will be appreciated that this can be implemented using input stages, usually transconductances. Additional elements such as the illustrated equivalent resistive loads—or equivalent impedances—are used to translate the signal within the gain block 130 back to voltage values which are gained and buffered. A differential to single-ended conversation via the illustrated amplifier/buffer stage 600 driving the output pin.

It will be further appreciated that chopping and auto-zero techniques can be used in the gain block 130 to modulate the noise away from low frequency if desired.

It will be appreciated that there are a number of advantages that can be derived from implementations such as that heretofore described. By providing an amplifier with integrated interpolation functionality it is possible to provide an additional DAC stage to a DAC architecture that already employs multiple DAC stages. The usage of the interpolation as an additional and probably final DAC stage enables reduction of component count in medium (circa 12 bit) to high (>=16 bit) resolution DACs. This can be used advantageously to reduce circuitry cost, improve performance and reduce the test cost vs one or two stage DAC architectures. The amplifier interpolation implementation is in itself not critical for the performance of the functionality and the person of skill will appreciate that there are other ways to achieve such interpolation that differ from the specific of the schematics herein described, with example references provided.

It will be appreciated that as the interpolation functionality takes an input from a preceding DAC architecture that the effect is a multi-mode interpolation buffer and the logic code that is used for interpolation is dependent on that used in previous DAC stages.

Optimisation of the DAC can be achieved in a number of different ways; for example parasitic impedance can be integrated into the optimization.

It will be understood that where the elements or devices that are used to fabricate the individual strings of the DAC are described with reference to resistors having a resistance that these are specific examples of impedance elements each having an associated impedance. The present teaching is not to be construed as being limited to resistors and resistance and other examples of impedance elements may be used within the overall context of the present teaching. While not specifically illustrated in the figures, the person of skill will appreciate that where a DAC is provided in a string architecture that there are a plurality of switches associated with the string of impedance elements and that these switches could be provided as MOS switches. However it will be understood that the operation of the present teaching is not limited to MOS switches and can be employed using Junction Field Effect Transistors (JFET) switches, Metal Semiconductor FET (MESFET), High Electron Mobility Transistors (HEMT), FinFETs or other non-planar MOS topologies or any other switching scheme used in converters. Furthermore, it will be appreciated that MOS devices are not manufactured using metal-oxide-semiconductor construction in modern technologies but this is the conventional term used to described generically modern "CMOS processes" including those implemented using poly gate or non-oxide insulation layer.

Other embodiments are within the spirit and scope of the appended claims. For example, due to manufacturing variances and second order non-ideal conditions, the nominal values of the resistors and other device components may be adjusted to give optimum results. Monte Carlo analysis, other statistical analysis or analog design optimization tools and methodologies may be used to perform this optimization. Further, various technologies may be used for the switches, such as CMOS transmission gates, one MOS transistor type (e.g., NMOS or PMOS), either of the above with a single, or plurality of, series resistors on one or both sides of the switch. Other configurations that could be considered applicable include those provided by Reverse Back biasing (RBB), Forward bulk biasing (FBB) and Adaptive back (or bulk) biasing (ABB).

While the present teaching has been described heretofore with reference to specific examples of conventional binary numbering arrangements as these represent commonly favoured and widely used implementations. However the present teaching should not be construed as being limited to such implementations as the teaching has application in non-binary base arrangements or different numbering systems such as for example relative primes.

Within the context of the present teaching the overall DAC resolution is a combination of the individual contributions by each of the stages. The architecture can be configured to provide additional or redundant states. The number of states provided does not have to exactly match those states that are actually used. In the context of providing a binary DAC resolution one or more of the individual stages may provide a non-binary contribution. The number of states provided by a DAC architecture in accordance with the present teaching can be equal to or greater than that actually required and this may prove useful in circuit optimisation.

The present teaching is not limited to the embodiments hereinbefore described but may be varied in both construction and detail. DAC architectures per the present teaching can be implemented in various electronic devices. Examples of the electronic devices can include, but are not limited to, consumer electronic products, parts of the consumer electronic products, electronic test equipment, wireless communications infrastructure, industrial control and control circuitry generally and other application as will be appreciated by those of ordinary skill. Examples of the electronic devices can also include circuits of optical networks or other communication networks, and driver circuits. The consumer electronic products can include, but are not limited to, measurement instruments, medical devices, wireless devices, a mobile phone (for example, a smart phone), cellular base stations, a telephone, a television, a computer monitor, a computer, a hand-held computer, a tablet computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a scanner, a multi-functional peripheral device, a wrist watch, a clock, etc. Further, the electronic device can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

The teachings of the present specification can be applied to other systems, not necessarily the circuits described above. The elements and acts of the various embodiments described above can be combined to provide further embodiments. The act of the methods discussed herein can be performed in any order as appropriate. Moreover, the acts of the methods discussed herein can be performed serially or in parallel, as appropriate.

While certain embodiments of the present specification have been described, these embodiments have been presented by way of example only, and are not intended to limit the scope of the disclosure. Indeed, the novel methods and circuits described herein may be embodied in a variety of other forms. Furthermore, various omissions, substitutions and changes in the form of the methods and circuits described herein may be made without departing from the spirit of the disclosure. The accompanying claims and their equivalents are intended to cover such forms or modifications as would fall within the scope and spirit of the disclosure. Accordingly, the scope of the present specification is defined by reference to the claims.

The invention claimed is:

1. A multi-stage digital to analog convertor (DAC) circuit configured to convert a digital input code to an analog output, the circuit comprising a first stage switchably coupled to a primary stage in each of a first DAC path and a second DAC path, the first stage comprising a plurality of impedance elements and wherein the circuit is configured such that operably a switching of the plurality of impedance elements across the primary stage in the first DAC path provides a first plurality (N1) of state changes and a switching of the plurality of impedance elements across the primary stage in the second DAC path provides a second plurality (N1b) of state changes, the second plurality, N1b, being less than the first plurality, N1, and wherein each of the first DAC path and the second DAC path are coupled to a common output of the DAC circuit and at least one of the DAC paths is coupled to an interpolator, the interpolator providing an additional DAC stage to that path.

2. The multi-stage DAC circuit of claim 1 wherein the first DAC path comprises a plurality of DAC stages arranged in series.

3. The multi-stage DAC circuit of claim 2 wherein each of the plurality of DAC stages is configured to provide a number of state changes, successive stages of the plurality of DAC stages having a lower resolution than preceding stages.

4. The multi-stage DAC circuit of claim 1 configured to effect a loading on the primary stage by the first DAC path during a switching of the second DAC path.

5. The multi-stage DAC circuit of claim 1 wherein the first DAC path has a greater resolution than the second DAC path such that the first DAC path provides a coarse transfer function of the DAC and the second DAC path provides a fine transfer function of the DAC.

6. The multi-stage DAC circuit of claim 1 wherein the common output comprises a gain block comprising the interpolator.

7. The multi-stage DAC circuit of claim 6 wherein each of the first DAC path and the second DAC path provide an input to the interpolator.

8. The multi-stage DAC circuit of claim 7 wherein the interpolator provides an additional DAC stage to each of the first and second DAC paths.

9. The multi-stage DAC circuit of claim 7 wherein the interpolator is operable at full scale and zero scale modes so as to provide a non-interpolating buffer function.

10. The multi-stage DAC circuit of claim 6 wherein the primary stage of the second DAC path is coupled directly to the gain block.

11. The multi-stage DAC circuit of claim 6 wherein the primary stage of the first DAC path is coupled to the gain block via at least one subsequent stage of the first DAC path.

12. The multi-stage DAC circuit of claim 1 wherein the interpolator is provided separate to the common output.

13. The multi-stage DAC circuit of claim 6 wherein the gain block comprises a comparator, the first DAC path and the second DAC path being arranged to provide a first input to the comparator, the comparator comprising a second input and configured to effect a comparison between signals provided at each of the first and second input.

14. The multi-stage DAC circuit of claim 13 wherein the second input of the comparator is coupled to a sense network.

15. The multi-stage DAC circuit of claim 14 wherein the sense network comprises a first sense input and a second sense input, the sense network arranged to provide reconfigurable multiple channels to the second input of the comparator.

16. The multi-stage DAC circuit of claim 14 wherein the sense network comprises a DAC stage.

17. The multi-stage DAC circuit of claim 6 wherein the gain block comprises an amplifier incorporating the interpolator to provide an internal DAC function, the amplifier having a first input from each of the first and second DAC paths and a second input, wherein the interpolator is configured to provide additional resolution code to that provided by the first DAC path and the second DAC path.

18. The multi-stage DAC circuit of claim 17 wherein the amplifier output is quantized to provide a comparator function using inputs from each of the first and second input to the amplifier.

19. The multi-stage DAC circuit of claim 17 wherein the second input is coupled to a feedback loop from an output of the gain block.

20. A multi-stage digital to analog converter (DAC) circuit comprising a plurality of DAC stages coupled to an amplifier at an output of the circuit, the amplifier incorporating an internal DAC stage, the amplifier having a first input from the plurality of DAC stages and a second input coupled to a sense network, wherein the internal DAC stage is configured to provide additional resolution of a DAC input code to that provided by the plurality of DAC stages.

21. The multi-stage DAC circuit of claim 20 wherein the second input is coupled to a feedback loop from an output of the amplifier.

22. The multi-stage DAC circuit of claim 20 wherein the sense network comprises a first sense input and a second sense input, the sense network arranged to provide reconfigurable multiple channels to the second input of the amplifier.

23. The multi-stage DAC circuit of claim 20 wherein the sense network comprises a DAC stage.

24. A method of converting a digital input code to an analog output using a digital to analog convertor (DAC) circuit, the DAC circuit comprising a first stage switchably coupled to a primary stage in each of a first DAC path and a second DAC path, the first stage comprising a plurality of impedance elements and each of the first DAC path and the second DAC path being coupled to a common output of the DAC circuit, the method comprising:
 a. Operating the DAC in a first mode wherein a switching of the plurality of impedance elements across the primary stage in the first DAC path provides a first plurality, N1, state changes
 b. Operating the DAC in a second mode wherein a switching of the plurality of impedance elements across the primary stage in the second DAC path provides a second plurality, N1b, state changes, wherein the second plurality, N1b, of state changes is less than the first plurality, N1, of state changes; and
 c. Interpolating within a voltage range defined by at least one of the DAC paths.

25. The method of claim 24 comprising using the common output to gain an output from each of the first DAC path and the second DAC path.

26. The method of claim 24 comprising using the common output to interpolate outputs from each of the first DAC path or the second DAC path.

27. The method of claim 24 comprising using the common output to provide an additional DAC stage to each of the first DAC path and the second DAC path.

28. The multi-stage DAC circuit of claim 20, further comprising a comparator, wherein the amplifier is part of the comparator.

* * * * *